United States Patent
Neilson

(10) Patent No.: US 7,949,973 B1
(45) Date of Patent: May 24, 2011

(54) METHODS OF IMPLEMENTING MULTI-CYCLE PATHS IN ELECTRONIC CIRCUITS

(75) Inventor: Kevin Marc Neilson, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 413 days.

(21) Appl. No.: 12/061,786

(22) Filed: Apr. 3, 2008

(51) Int. Cl.
*G06F 17/50* (2006.01)
*G06F 9/455* (2006.01)

(52) U.S. Cl. .................... 716/104; 716/106; 703/13

(58) Field of Classification Search .............. 716/18, 716/104, 106; 703/13
See application file for complete search history.

(56) References Cited

U.S. PATENT DOCUMENTS

| | | | | |
|---|---|---|---|---|
| 5,825,658 | A * | 10/1998 | Ginetti et al. | 716/6 |
| 6,226,776 | B1 * | 5/2001 | Panchul et al. | 716/102 |
| 7,085,702 | B1 * | 8/2006 | Hwang et al. | 703/15 |
| 7,382,824 | B1 * | 6/2008 | Marmash et al. | 375/224 |
| 2001/0034876 | A1 * | 10/2001 | Panchul et al. | 716/18 |
| 2003/0225559 | A1 * | 12/2003 | Sharma | 703/16 |
| 2007/0011527 | A1 * | 1/2007 | Goswami et al. | 714/726 |
| 2007/0089076 | A1 * | 4/2007 | Amatangelo | 716/6 |

* cited by examiner

*Primary Examiner* — Vuthe Siek
*Assistant Examiner* — Patrick Sandoval
(74) *Attorney, Agent, or Firm* — Lois D. Cartier; LeRoy D. Maunu

(57) ABSTRACT

Methods of implementing circuits while automatically taking multi-cycle paths into account. A processor-implemented method can include inputting a behavioral description of the circuit, a simulation test bench for the circuit, and a library that includes at least one synchronous element. The synchronous element includes code that, when simulated, outputs tracking information including a minimum number of clock cycles between state changes for terminals of the synchronous element. The behavioral description is synthesized to generate a netlist description of the circuit. The netlist description includes at least one instance of the synchronous element. The netlist description is simulated using the simulation test bench and the library. The simulation outputs a description of all multi-cycle paths in the netlist description based on the tracking information output by all instances of the synchronous element in the netlist description. This description can provide constraints for use when placing and routing the design.

20 Claims, 2 Drawing Sheets

METHODS OF IMPLEMENTING MULTI-CYCLE PATHS IN ELECTRONIC CIRCUITS

FIELD OF THE INVENTION

The invention relates to electronic circuits including synchronous elements. More particularly, the invention relates to methods of implementing circuits that include multi-cycle synchronous paths.

BACKGROUND

Programmable integrated circuits (ICs) are a well-known type of integrated circuit that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For these exemplary programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

A circuit design for a programmable IC is typically initially described in the form of an HDL (hardware description language) behavioral description (e.g., VHDL or Verilog code). The circuit description is compiled into a netlist, a description of elements included in the circuit and the interconnections among the elements, using a synthesis tool. The synthesis tool converts the HDL description into a circuit implementation that incorporates specific elements selected from a library of available elements. When the library elements correspond to the elements available in a programmable IC, the synthesis output is a netlist appropriate for implementation in that programmable IC.

In other instances, the netlist may be generated from a schematic, where the schematic is implemented using icons corresponding to the same library elements.

In either case, the netlist is then provided to implementation software, which "maps" the elements of the circuit to elements physically present in the programmable IC, "places" the mapped elements into specific instances of the available elements, and "routes" signal paths among the various placed elements as dictated by the netlist. The mapped, placed, and routed design is then converted into a stream of bits (the configuration data) that can be used to program the design into a programmable IC.

The placement and routing phases are often accomplished as a single step, because while the routing naturally depends upon the placement, the placement may also benefit by taking into consideration the number and type of available routing resources between the programmable elements in various locations. Thus, this set of implementation tools is often referred to as "place-and-route software".

Place-and-route software can benefit from the provision of "constraints", e.g., a constraints file that indicates certain circuit requirements, such as maximum delays on various paths, or a maximum clock frequency in a synchronous design. Another type of constraint that is sometimes used for synchronous designs is a listing of "multi-cycle paths". A multi-cycle path is any path in the design that originates at the output of one synchronous element (a clocked element such as a flip-flop, for example) and extends to the input of another synchronous element that does not change state more often than every N clock cycles, where $N>=2$. In other words, the destination element changes state no more often than every other clock cycle.

Clearly, it can be beneficial to indicate multi-cycle paths, to prevent the place-and-route software from consuming unnecessary resources by attempting to route a multi-cycle path within the time period of a single clock cycle. However, many users are unaware of the desirability of such constraints. Further, some users may be unaware of the presence of multi-cycle paths in their designs, particularly when the circuit is specified using a high-level design tool or HDL. Therefore, it is not uncommon for place-and-route tools to attempt to impose single-cycle timing on multi-cycle paths within a circuit, to the overall detriment of circuit performance. In some instances, place-and-route software may even report failure to implement the design within the specified timing constraints, when in reality the design does meet the timing criteria for the design.

Therefore, it is desirable to provide methods by which multi-cycle paths can be taken into consideration during the place-and-route process, without requiring manual intervention to identify the multi-cycle paths.

SUMMARY

The invention provides methods of implementing circuits while automatically taking multi-cycle paths into account. According to one embodiment of the invention, a processor-implemented method includes inputting a behavioral description of a circuit, a simulation test bench for the circuit, and a library that includes at least one synchronous element (e.g., a flip-flop). The synchronous element includes code that, when simulated, outputs tracking information including a minimum number of clock cycles between state changes for terminals of the synchronous element. The behavioral description is then synthesized to generate a netlist description of the circuit. The netlist description includes at least one instance of the synchronous element. The netlist description is then simulated using the simulation test bench and the library. The simulation outputs a description of all multi-cycle paths in the netlist description based on the tracking information output by all instances of the synchronous element in the netlist description.

In some embodiments, the simulation outputs the description of the multi-cycle paths in the form of a constraints file readable by a place-and-route tool. The network description is then placed and routed, by the place-and-route tool and using the constraints file, to generate a placed-and-routed design. In some embodiments, the placed and routed design is then used to generate and output configuration data for implementing the circuit in a programmable IC.

According to another aspect of the present invention, a processor-implemented method includes inputting a simulation test bench for a circuit, a library that includes at least one synchronous element (e.g., a flip-flop), and a netlist description of the circuit. The synchronous element includes code that, when simulated, outputs tracking information including a minimum number of clock cycles between state changes for terminals of the synchronous element. The netlist description includes at least one instance of the synchronous element. The netlist description is then simulated using the simulation test bench and the library. The simulation outputs a constraints file including a description of all multi-cycle paths in the netlist description based on the tracking information output by all instances of the synchronous element in the netlist description. The netlist description is then placed and routed using the constraints file to generate a placed-and-routed design, which is then output. In some embodiments, configuration data is then generated and output, from the placed-and-routed design, for implementing the circuit in a programmable IC.

The invention also provides a computer program product including a computer-usable medium having computer-usable program code that, when executed by an information processing system, causes the information processing system to perform the various functions disclosed herein.

BRIEF DESCRIPTION OF THE DRAWINGS

The present invention is illustrated by way of example, and not by way of limitation, in the following figures.

DETAILED DESCRIPTION OF THE DRAWINGS

The present invention is applicable to a variety of methods and systems for implementing designs in integrated circuits (ICs). The present invention has been found to be particularly applicable and beneficial for implementing user designs in programmable ICs. An appreciation of the present invention is presented by way of specific examples utilizing programmable ICs such as field programmable gate arrays (FPGAs). However, the present invention is not limited by these examples, and can be applied to virtually any IC that includes programmable resources.

As previously described, when known methods are used it is not uncommon for place-and-route tools to attempt to impose single-cycle timing on multi-cycle paths within a circuit, to the overall detriment of circuit performance. In some instance, place-and-route software may even report failure to implement the design within the specified timing constraints, when in reality the design does meet the timing criteria for the design. For example, the following HDL code describes an exemplary synchronous circuit.

```
timescale 1ns/1ps
/****************************************
* multicycle.v
****************************************/
module multicycle
    {
    input                clk,    // main clock
    input                reset,  // sync reset
    input       [2:0]    a,      // input data
    output reg  [3:0]    sum     // a+1
    };
/****************************************
* variables
****************************************/
    reg   [1:0]  counter;
    reg          sum_enable;
    reg   [2:0]  a_pipe;
/****************************************
* Synchronous Process
* The output of sum_enable is a multi-cycle path
****************************************/
always@(posedge clk)
    if (reset)
        begin
            counter      <= 0;
            sum_enable   <= 0;
            sum          <= 0;
            a_pipe       <= 0;
        end
    else
        begin
            if (counter==2)
                counter <=0;
            else
                counter <= counter + 1;
            sum_enable <= counter==0;
            if (sum_enable)
                begin
                    a_pipe   <= a;
                    sum      <= a_pipe + 1;
                end
        end
endmodule
```

A synthesis or place-and-route tool would typically be unable to realize that "sum_enable" is a flip-flop output with a 3-cycle output. To make this determination is somewhat difficult: the tool must realize that the sum_enable output signal only changes state when the "counter" register has the value of zero, and also that the counter register only has the zero value every three clock cycles. If the user does not explicitly inform the place-and-route tool of this multi-cycle path, then the tool will assume that the output of sum_enable changes with every clock cycle.

Figure 1:
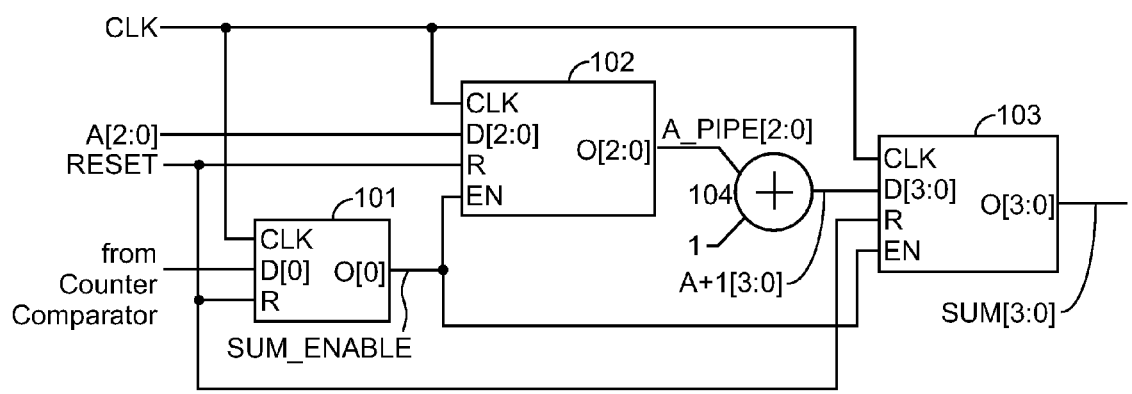
FIG. 1 schematically illustrates a synchronous circuit useful in understanding the present invention.

FIG. 1 illustrates a block diagram of a portion of the synchronous circuit described by the above HDL code. The block diagram includes three registers 101, 102, 103, of one, three, and four bits, respectively, and an adder 104, coupled together as shown in FIG. 1 and as described in the above HDL code. As is clear from the HDL code, the sum_enable signal is high only one clock cycle out of every three cycles. Therefore, the path from A_PIPE register 102 to the D input of the SUM register 103, and the paths driven by the output of the SUM register 103, change state only every three clock cycles.

If the place-and-route tool is aware of this fact, the constraints are relaxed considerably when implementing these paths, and the tool can quickly converge to a routed design that meets the constraints. This freedom also allows the tool to give priority to more critical paths, allowing these more critical paths to use more direct routing resources. If not privy to this information, the place-and-route tool may very well report that the circuit cannot operate within the necessary constraints, when it would actually be possible for the circuit to do so.

In theory, it should be possible for a place-and-route tool with a sufficient artificial intelligence to evaluate the HDL code and determine the multi-cycle paths. However, this is very difficult in practice, and may even become impossible when multi-cycle paths are not initially present in the code, but only appear when appropriate stimulus is applied to the code. For example, if the portion of the circuit illustrated in FIG. 1 were evaluated by itself (i.e., without the rest of the HDL code), it would not be possible to detect the presence of the multi-cycle paths in the circuit.

The present invention uses a circuit simulation to exercise the circuit inputs for a period of time, where the period of time is sufficient to detect all multi-cycle paths through the circuit, and reports all detected multi-cycle paths to the place-and-route tool. The simulation step is preferably performed after synthesis, if synthesis is used to generate the circuit, because after synthesis all synchronous elements are present in the circuit and have been named. This may not be the case prior to synthesis, because the synthesizer may add synchronous elements not explicitly described in the circuit description, or may move or rename such elements.

To enable this approach, special code is inserted in the code for a synchronous library element. This special code provides tracking information for the synchronous element, e.g., by reporting the minimum number of clock cycles between state changes for the terminals of the synchronous element. For example, the following code describes a clock-enabled flip-flop. In this example, special code is inserted (following the comment "// Special code begins here") that determines the minimum number of clock cycles between any changes for the data input (D) and data output (Q) terminals of the flip-flop.

```
// Standard flip-flop model modified to add tracking information for data input (D) &
// data output (Q) terminals
module FDRE (Q, C, CE, D, R);
    parameter INIT = 1'b0;
    output Q;
    input C, CE, D, R;
    wire Q;
    reg q_out;
    tri0 GSR = glbl.GSR;
    initial q_out = INIT;
    assign Q = q_out;
    always @(GSR)                                    // GSR = Asynchronous (Global) reset
        if (GSR)
            assign q_out = INIT;
        else
            deassign q_out;
    always @(posedge C)                              // C = Clock or CLK
        if (R)                                       // R = Synchronous reset
            q_out <= 0;
        else if (CE)                                 // CE = Clock enable
            q_out <= D;                              // D = Data in
    specify
        if (R)
            (posedge C => (Q +: 1'b0)) = (100, 100); // Q = Flip-flop output
        if (!R && CE)
            (posedge C => (Q +: D)) = (100, 100);
    endspecify
    integer    input_multicycle_cnt =00;
    integer    output_multicycle_cnt =00;
    integer    input_multicycles     =100;
    integer    output_multicycles    =100;
    reg        Q_pipe, D_pipe;
    // Special code begins here
    always@(posedge C)
        begin
            D_pipe <= D;
            if (D!=D_pipe)
                begin
                    input_multicycle_cnt <= 1;
                    if (input_multicycle_cnt<input_multicycles)
                        input_multicycles <= input_multicycle_cnt;
                end
            else
                input_multicycle_cnt <= input_multicycle_cnt + 1;
        end
    always@(posedge C)
        begin
            Q_pipe <= Q;
            if (Q!=Q_pipe)
                begin
                    output_multicycle_cnt <= 1;
                    if (output_multicycle_cnt<output_multicycles)
                        output_multicycles <= output_multicycle_cnt;
                end
```

```
            else
                output_multicycle_cnt <= output_multicycle_cnt + 1;
        end
always@(glbl.REPORT)
if (glbl.REPORT)
    begin
        if (output_multicycles>1)
            $display ("Multicycle path from %m to * %0d cycles",output_multicycles);
        if (input_multicycles>1)
            $display("Multicycle path from * to %m %0d cycles",input_multicycles);
    end
endmodule
```

When a circuit includes at least one instance of the synchronous element, the special code is incorporated into the netlist description of the circuit. However, the code is not realized in the circuit itself. Instead, it is used only during simulation of the circuit, to track the terminal changes of the synchronous elements, as described above. At the termination of the simulation, the global signal glbl.REPORT is asserted, causing all multi-cycle paths from all flip-flops in the circuit to be displayed.

In one embodiment, the "multicycle" module, for which the HDL code is provided earlier in this specification, was synthesized, and the post-synthesis netlist was provided in Verilog format. The synthesizer tool used the FDRE module, for which the HDL code is provided above, to implement the three registers. The post-synthesis netlist was simulated, using random input data for the a[2:0] input. Eleven multi-cycle paths were detected and displayed for the circuit, as follows:
Multicycle path from test.multicycle.\a_pipe_Z[2] to * 3 cycles
Multicycle path from test.multicycle.\a_pipe_Z[1] to * 3 cycles
Multicycle path from test.multicycle.\a_pipe_Z[0] to * 3 cycles
Multicycle path from test.multicycle.\sum_Z[3] to * 3 cycles
Multicycle path from * to test.multicycle.\sum_Z[3] 3 cycles
Multicycle path from test.multicycle.\sum_Z[2] to * 3 cycles
Multicycle path from * to test.multicycle.\sum_Z[2] 3 cycles
Multicycle path from test.multicycle.\sum_Z[1] to * 3 cycles
Multicycle path from * to test.multicycle.\sum_Z[1] 3 cycles
Multicycle path from test.multicycle.\sum_Z[0] to * 3 cycles
Multicycle path from * to test.multicycle.\sum_Z[0] 3 cycles Note that the pathnames were reported using post-synthesis names. As previously described, this approach ensures that the synchronous elements are accurately identified and the identification will not be ambiguous to the place and route tools. Because many of these paths flow through an adder (element 104 in FIG. 1), which can be a long combinatorial path, the addition of these multi-cycle constraints may materially aid in converging to a valid routing solution for the circuit.

In other embodiments, the multi-cycle paths are output by other means. For example, in some embodiments the multi-cycle paths are written directly to a constraints file using the proper constraints syntax for a place-and-route tool for a programmable IC. In these embodiments, the multi-cycle paths can be automatically taken into account when placing and routing a design, without any intervention from the user.

Clearly, the above example monitors only the states of the data input (D) and the data output (Q) terminals. However, this exemplary flip-flop also has a synchronous reset input (R), which could also be monitored in a similar fashion, if desired. Similarly, tracking information can be provided for any and/or all synchronous inputs and/or outputs of a flip-flop, as desired. Also, special code similar to the above (and/or other specialized tracking code) can be added to circuit elements other than flip-flops. In one embodiment, special code similar to the above is added to all synchronous circuit elements in a simulation library. It will be apparent to one skilled in the art after reading this specification that the present invention can be practiced within these and other variations.

Figure 2:
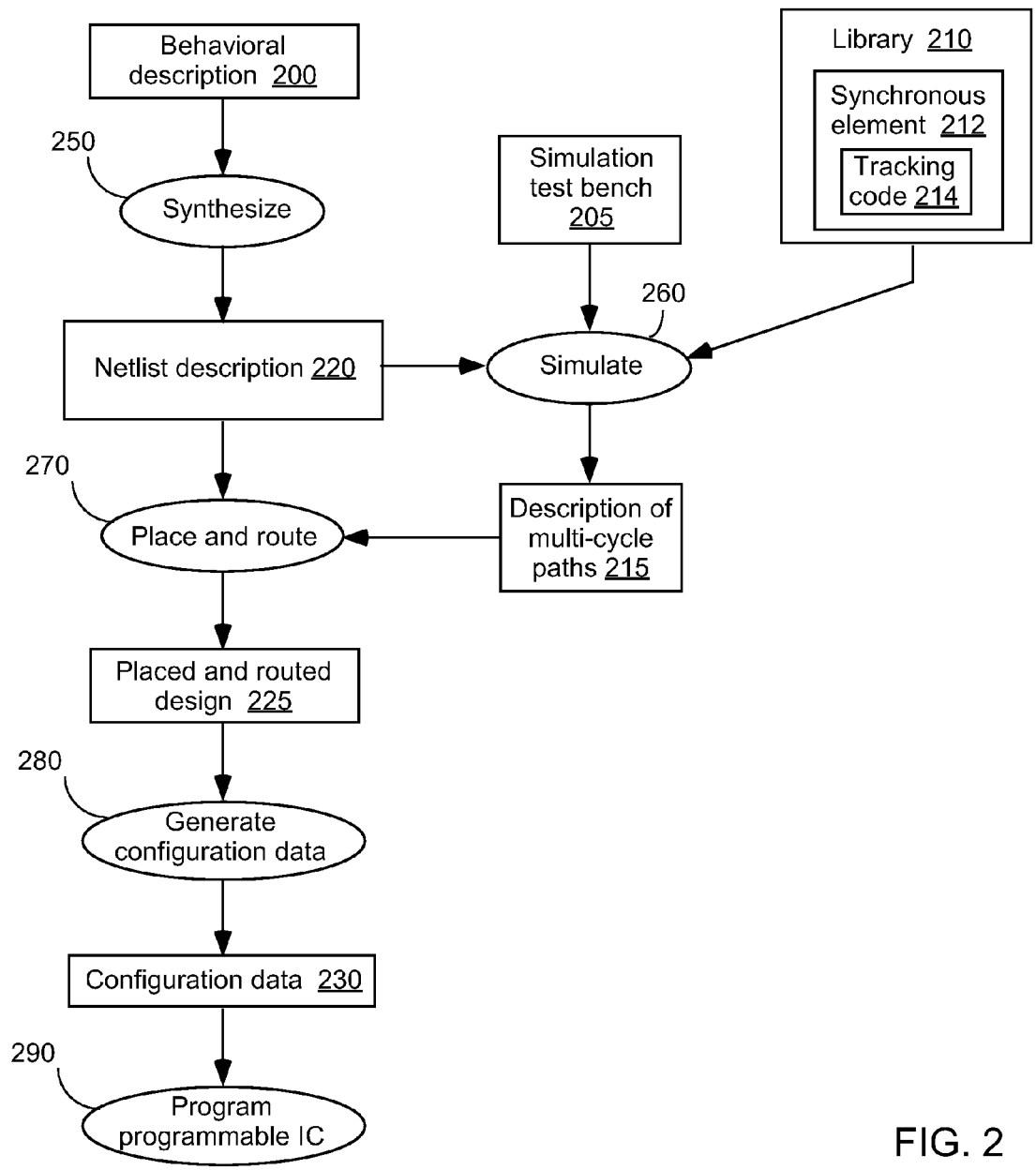
FIG. 2 illustrates the steps of an exemplary method of implementing a circuit while automatically taking multi-cycle paths into account.

FIG. 2 illustrates the steps of an exemplary method of implementing a circuit in a programmable IC while automatically taking multi-cycle paths into account. Two elements are input, a behavioral description 200 (e.g., an HDL description) of a circuit, and a library 210. The library includes at least one synchronous element 212, which in turn includes tracking code 214 that, when simulated, outputs tracking information including a minimum number of clock cycles between state changes for terminals of the synchronous element. A synthesis tool then synthesizes the behavioral description 200 in step 250, generating a netlist description 220 of the circuit. In some embodiments, the library 210 is used in creating the netlist description, as well as being a simulation library. In other embodiments, the library 210 is a simulation library only, and is not used in creating the netlist description. However, in both cases, the netlist description 220 includes at least one instance of the synchronous element 212.

In step 260, a simulation tool simulates the netlist description 220, using a simulation test bench 205 and the library 210 (e.g., at least the simulation model for synchronous element 212 included in the library 210). The simulation outputs a description 215 of all multi-cycle paths in the netlist description, based on the tracking information output by all instances of the synchronous element 212 in the netlist description. As used herein, the term "outputting", "output", or "outputs" can mean, without limitation, writing to a file, writing to a user display or other output device, playing audible notifications or providing other physical feedback to a user, sending or transmitting to another system, exporting, or the like. For example, in some embodiments the description 215 of the multi-cycle paths is in the form of a constraints file readable by place-and-route software.

The methods of the invention provide accurate results when the simulation test bench 205 is complete, e.g., when the test bench includes examples of all input data sequences that will be encountered by the circuit during operation. If the test bench is incomplete, the tracking information may be inaccurate. For example, when the test bench is incomplete, the description 215 of all multi-cycle paths in the netlist description 220 may erroneously report multi-cycle paths that do not actually exist.

In step 270, the netlist description 220 is placed and routed, using the multi-cycle path description 215, to produce a placed and routed design 225. In step 280, the configuration data 230 is generated from the placed and routed design 225. In step 290, the configuration data 230 is used to program the target programmable IC.

The flowchart in FIG. 2 illustrates the architecture, functionality, and operation of possible implementations of systems, methods and computer program products according to various embodiments of the present invention. In this regard, each elliptical block in the flowchart may represent a module, segment, or portion of code, which comprises one or more portions of computer-usable program code that implement the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustration, and combinations of blocks in the flowchart illustration, can be implemented by special purpose hardware-based systems that perform the specified functions or acts, or combinations of special purpose hardware and computer instructions.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suitable. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "tool", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

Those having skill in the relevant arts of the invention will now perceive various modifications and additions that can be made as a result of the disclosure herein. The invention can be embodied in other forms without departing from the spirit or essential attributes thereof. For example, the above text describes the methods of the invention in the context of programmable ICs such as programmable logic devices (PLDs), Field Programmable Gate Arrays (FPGAs), and Complex Programmable Logic Devices (CPLDs). However, the methods of the invention can also be applied to other integrated circuits, such as Application Specific Integrated Circuits (ASICs). In some embodiments, for example, the methods of the invention are applied to prototyping ASICs. Accordingly, all such modifications and additions are deemed to be within the scope of the invention, which is to be limited only by the appended claims and their equivalents. Note that claims listing steps do not necessarily imply any order of the steps. For example, when inputting files, the files can be input in any order, as long as the files are input prior to their use by subsequent functions. Trademarks are the property of their respective owners.

What is claimed is:

1. A processor-implemented method, comprising:
   inputting a behavioral description of a circuit;
   inputting a simulation test bench for the circuit;
   inputting a library that includes at least one synchronous element;
   wherein the synchronous element includes code that, when simulated, outputs tracking information including a minimum number of clock cycles between state changes for terminals of the synchronous element;
   wherein the code is not implemented in a realization of the circuit and is used only for simulation of synchronous elements;
   synthesizing the behavioral description to generate a netlist description of the circuit;
   wherein the netlist description includes at least one instance of the synchronous element;
   simulating the netlist description using the simulation test bench and the library; and
   wherein the simulating outputs a description of all multi-cycle paths in the netlist description based on the tracking information output by all instances of the synchronous element in the netlist description.

2. The method of claim 1, wherein the synchronous element comprises a flip-flop.

3. The method of claim 2, wherein the terminals comprise data input and data output terminals for the flip-flop.

4. The method of claim 1, wherein the simulating outputs the description of the multi-cycle paths in the form of a constraints file readable by a place-and-route tool, and the method further comprises:
   placing and routing the netlist description, by the place-and-route tool and using the constraints file, to generate a placed and routed design.

5. The method of claim 4, further comprising:
   generating and outputting configuration data, from the placed and routed design, for implementing the circuit in a programmable integrated circuit.

6. The method of claim 5, further comprising:
   programming the programmable integrated circuit with the configuration data.

7. The method of claim 6, wherein the programmable integrated circuit comprises a programmable logic device (PLD).

8. The method of claim 7, wherein the PLD comprises a field programmable gate array (FPGA).

9. A computer program product, comprising:
   a non-transitory computer-usable medium having computer-usable program code that, when executed by an information processing system, causes the information processing system to perform the functions of:
   inputting a behavioral description of a circuit;
   inputting a simulation test bench for the circuit;

inputting a library that includes at least one synchronous element;

wherein the synchronous element includes code that, when simulated, outputs tracking information including a minimum number of clock cycles between state changes for terminals of the synchronous element;

wherein the code is not implemented in a realization of the circuit and is used only for simulation of synchronous elements;

synthesizing the behavioral description to generate a netlist description of the circuit;

wherein the netlist description includes at least one instance of the synchronous element;

simulating the netlist description using the simulation test bench and the library; and wherein the simulating outputs a description of all multi-cycle paths in the netlist description based on the tracking information output by all instances of the synchronous element in the netlist description.

10. The computer program product of claim 9, wherein the synchronous element comprises a flip-flop.

11. The computer program product of claim 9, wherein the simulating outputs the description of the multi-cycle paths in the form of a constraints file readable by a place-and-route tool, and wherein the computer-usable medium further comprises computer-usable program code that, when executed by the information processing system, causes the information processing system to perform the function of:

placing and routing the netlist description, by the place-and-route tool and using the constraints file, to generate a placed-and-routed design.

12. The computer program product of claim 11, wherein the computer-usable medium further comprises computer-usable program code that, when executed by the information processing system, causes the information processing system to perform the function of:

generating and outputting configuration data, from the placed-and-routed design, for implementing the circuit in a programmable integrated circuit.

13. The computer program product of claim 9, wherein the computer-usable medium further comprises the library.

14. A processor-implemented method, comprising:
inputting a simulation test bench for a circuit;
inputting a library that includes at least one synchronous element;

wherein the synchronous element includes code that, when simulated, outputs tracking information including a minimum number of clock cycles between state changes for terminals of the synchronous element;

wherein the code is not implemented in a realization of the circuit and is used only for simulation of synchronous elements;

inputting a netlist description of the circuit;

wherein the netlist description includes at least one instance of the synchronous element;

simulating the netlist description using the simulation test bench and the library;

wherein the simulating outputs a constraints file including a description of all multi-cycle paths in the netlist description based on the tracking information output by all instances of the synchronous element in the netlist description;

placing and routing the netlist description using the constraints file to generate a placed-and-routed design; and outputting the placed-and-routed design.

15. The method of claim 14, wherein the synchronous element comprises a flip-flop.

16. The method of claim 15, wherein the terminals comprise data input and data output terminals for the flip-flop.

17. The method of claim 14, further comprising:
generating and outputting configuration data, from the placed-and-routed design, for implementing the circuit in a programmable integrated circuit.

18. The method of claim 17, further comprising:
programming the programmable integrated circuit with the configuration data.

19. The method of claim 18, wherein the programmable integrated circuit comprises a programmable logic device (PLD).

20. The method of claim 19, wherein the PLD comprises a field programmable gate array (FPGA).

* * * * *